United States Patent [19]

Helber, Jr. et al.

[11] Patent Number: 5,290,423
[45] Date of Patent: Mar. 1, 1994

[54] ELECTROCHEMICAL INTERCONNECTION

[75] Inventors: Carlyle L. Helber, Jr., Fountain Valley; Frank A. Ludwig, Rancho Palos Verdes, both of Calif.

[73] Assignee: Hughes Aircraft Company, Los Angeles, Calif.

[21] Appl. No.: 873,848

[22] Filed: Apr. 27, 1992

[51] Int. Cl.$^5$ .............................................. C25D 5/02
[52] U.S. Cl. ...................... 205/114; 29/840; 29/843; 205/123; 205/148
[58] Field of Search ............... 205/123, 114, 115, 148; 29/840, 843; 437/183

[56] References Cited

U.S. PATENT DOCUMENTS

| | | | |
|---|---|---|---|
| 4,930,001 | 5/1990 | Williams | 357/71 |
| 5,149,671 | 9/1992 | Koh et al. | 437/183 |
| 5,186,383 | 2/1993 | Melton et al. | 228/180.2 |
| 5,196,371 | 3/1993 | Kulesza et al. | 437/183 |

OTHER PUBLICATIONS

C. Bocking, "Laser Enhanced and High Speed Jet Selective Electrodeposition", Trans IMF 1988, 66, 50.

Primary Examiner—John Niebling
Assistant Examiner—William T. Leader
Attorney, Agent, or Firm—M. E. Lachman; M. W. Sales; W. K. Denson-Low

[57] ABSTRACT

Processes for fabricating electrochemical interconnections between semiconductor chip pads and substrate pads. First, pads on a substrate are electrically shorted by depositing a film of conductive metal, conductive bumps are created on the substrate pads, and the pads on the substrate are aligned with pads on a semiconductor chip. Then, by electrochemically depositing metal to the bumps, electrical interconnections are formed between the semiconductor chips pads and the substrate pads. Finally, the film of conductive metal is removed to eliminate the electrical shorting. The resulting electrochemical interconnections are highly reliable and have high tensile strengths.

14 Claims, 3 Drawing Sheets

ELECTROCHEMICAL INTERCONNECTION

BACKGROUND OF THE INVENTION

1. Field of the Invention

The present invention relates generally to electrical interconnections and methods for interconnecting electronic components. More particularly, the present invention relates to electrochemical interconnections and processes for fabricating electrochemical interconnections by connecting semiconductor pads and their corresponding substrate pads with electroplated metal.

2. Description of the Related Art

An ongoing effort within the electronics industry has been to develop semiconductor configurations with increasingly smaller packaging requirements. At the same time, semiconductors are being designed with demanding functional requirements and high production costs. Thus, semiconductor packaging design configurations having relatively small packaging requirements and having high production yields are finding increased utility within the electronics industry.

One approach associated with this effort is a recent trend toward the use of high frequency circuits and a corresponding increase in the utility of flip chips. Flip chips can reliably accommodate shorter interconnections between their interconnect pads and pads on a substrate than other chip designs such as the Tape Automated Bonding (TAB) chips and wire bond chips. These shorter connections advantageously permit greater pad packing densities on substrates. Additionally, the flip chips can be more densely packed onto the available substrate space.

The short interconnection between semiconductor flip chip pads and the corresponding substrate chip pads are commonly formed using either a solder melt method or a cold weld indium bonding method. Typically flip chips have interconnection pads at the chip periphery which normally require 256 bonds. When using the solder melt method, solder on the flip chip pads must be precisely aligned with solder on the corresponding substrate pads so that the two parts intimately face each other. Furthermore, this position should be maintained during the thermal exposure cycle so that the solder on each pad not only melts but cross-wets the opposing solder to form a structurally sound bond with only the corresponding opposite mating surface. If the melted solder extrudes or splatters or there is excessive solder bulging, electrical shorting between adjacent pads can result.

Since pad alignment, solder mass, and the degree of the gap at the pad interface all have very close tolerances, effective solder melt methods require the use of expensive precision equipment for aligning the substrate pads and the flip chip pads and applying the solder. Another disadvantage is the thermal exposure experienced by the chip. In many cases this is not a problem, but some semiconductors are damaged or degraded by elevated temperatures. Moreover, semiconductors which are removed and then reconnected during a rework process may not tolerate a second thermal exposure. A further disadvantage is the typically low tensile strength of solder melt interconnect bonds. The ultimate tensile strengths associated with these bonds are about 7000 pounds per square inch (psi) or 48 megapascals. Bonds of this strength are prone to failure and this method is not recommended for structural purposes.

The cold weld indium bonding method for forming short interconnections between semiconductor chip pads and substrate pads requires indium or indium alloy bump pads on the semiconductor chip and on the substrate. Additionally, these bump pads must have a precise mass, geometry and height. In principle, the chip and the substrate are precision aligned and the indium bumps are brought into "squash" contact such that the indium on the chip pads bonds to the indium on the corresponding substrate pads by cold welding to each other. Bonding is completed at room temperature because the indium need not be melted.

Generally, the cold weld indium bonding method works well for its intended use. However, the bond can fail during thermal cycling testing if there is a thermal expansion mismatch between the semiconductor chip and the substrate. This phenomena combined with other problems such as control over the indium bump mass, the bump geometry, and alignment problems can result in process yields as low as 3%. Like the solder melt interconnect method, the indium cold weld method results in bonds having undesirably weak tensile strengths. The indium cold weld method typically has tensile strengths on the order of 400 psi or 2.75 megapascals and is not recommended for structural purposes.

It would be desirable to provide processes for interconnecting semiconductor chip pads with substrate pads which reliably produce interconnect bonds having a high tensile strength in high yields. It would also be desirable to provide processes for interconnecting semiconductor chip pads with substrate pads which can be performed at room temperature without expensive equipment and without subjecting semiconductor chips to possible thermal degradation.

SUMMARY OF THE INVENTION

In accordance with the present invention, processes for electrochemically interconnecting semiconductor chips pads and their corresponding substrate pads are provided wherein the resulting interconnections are short and have advantageously high tensile strengths. The processes of the present invention utilize vapor deposition techniques and electrodeposition techniques to form reliable interconnections. Thus, the electronic components are not subject to the risk of thermal degradation during formation or quality testing. Moreover, because the semiconductor pads and substrate pads are finally joined by self-seeking electrodeposition processes, extremely accurate pad alignments and the resulting costly alignment equipment are not necessary.

In accordance with the present invention, processes for interconnecting pads on semiconductor chips with pads on a substrate are provided which generally include the steps of electrically shorting the pads on the substrate; creating conductive bumps on the pads on the substrate; aligning the pads on the substrate with the pads on the semiconductor chips; and then depositing metal to the bumps to form an electrochemical interconnection between the pads on the semiconductor chips and the pads on the substrate.

Preferably, shorting the pads on the substrate is accomplished by vapor depositing a film of conductive metal over the substrate so that the pads can receive electrical current for plating later in the process. The conductive bumps are a feature of the present invention and their geometry is instrumental in achieving reliable electrochemical interconnections. Preferred geometries can be achieved by using photoresist to define the size, shape and location of the pads and then depositing the appropriate metal to create the bumps.

Aligning the pads on the substrate with the pads on the semiconductor chips can be performed by simply placing the pads on the substrate in close proximity with the corresponding pads on the semiconductor chips. Then, depositing metal to the bumps to form an electrochemical interconnection is preferably accomplished by making the bumps cathodic, providing an external anode in contact with a metal plating solution, and pumping the plating solution past the bumps. When the bumps are in close proximity to the pads on the semiconductor chips, the metal will deposit initially to the cathodic bumps. As it continues to grow it will contact the opposing pad surface and then the opposing pad will become cathodic as well and metal will directly deposit to the semiconductor chip pad.

As a feature of the present invention the pads of the semiconductor chip can also be coated with a thin film of conductive metal and a preferred bump geometry can be formed on the thin film of conductive metal. This approach provides a process where depositing a metal to the bumps is much faster. This occurs because the bumps on the semiconductor chip pads and the bumps on the substrate can be aligned in intimate contact instead of in close proximity. This intimate contact causes all of the bumps to be cathodic during the electroplating process and metal deposits to all the bumps directly.

After the electrochemical interconnection is formed, the shorting conductive metal on the substrate should be removed so that the pads on the substrate are not electrically connected to each other and the electrical shorting is eliminated. It is also desirable to remove the photoresist which has acted as a mask for making the bumps from the substrate and from semiconductor chips if bumps were formed on the semiconductor chips.

In accordance with the present invention, electrochemical interconnections are provided which include a semiconductor chip pad having a surface and a corresponding substrate pad having a surface. The substrate pad surface has a film of conductive metal and a substrate conductive bump integral with the film. The substrate conductive bump and the semiconductor chip pad are joined in electrical communication by conductive deposit.

Alternatively and in accordance with the present invention the semiconductor chip pads can also have a surface with a layer of conductive metal on the surface and a semiconductor chip pad conductive bump integral with the film of conductive metal. In this case, the substrate conductive bump pad and the semiconductor chip pad conductive bump are joined in electrical communication by an electroplated deposit.

The above-discussed and many other features and attendant advantages of the present invention will become apparent as the invention becomes better understood by reference to the following detailed description when considered in conjunction with the accompanying drawings.

DESCRIPTION OF THE PREFERRED EMBODIMENTS

The present invention provides processes for interconnecting semiconductor chip pads and their corresponding substrate pads, and is based upon the discovery that reliable, high tensile strength bonds can be electrochemically formed between substrate chip pads and/or semiconductor chips. The present invention teaches techniques which involve pumping electroplating solutions into narrow gaps between substrate surfaces and their corresponding semiconductor chip surfaces. Because reliable interconnections depend upon the effective flow of plating solution to the plating surfaces and because flip chips typically have interconnecting pads on their periphery where the pads are more accessible to flowing solutions, the processes of the present invention are particularly suitable for interconnecting flip chip pads with substrate pads. However, those skilled in the art will appreciate that the processes of the present invention have utility for interconnecting any component with pads on a substrate, including chips with interconnection pads only at the chips periphery, which might require only 256 bonds or other types of flip chip sensors that might have over 16,000 bonds per chip in a checkerboard pattern.

Figure 1:
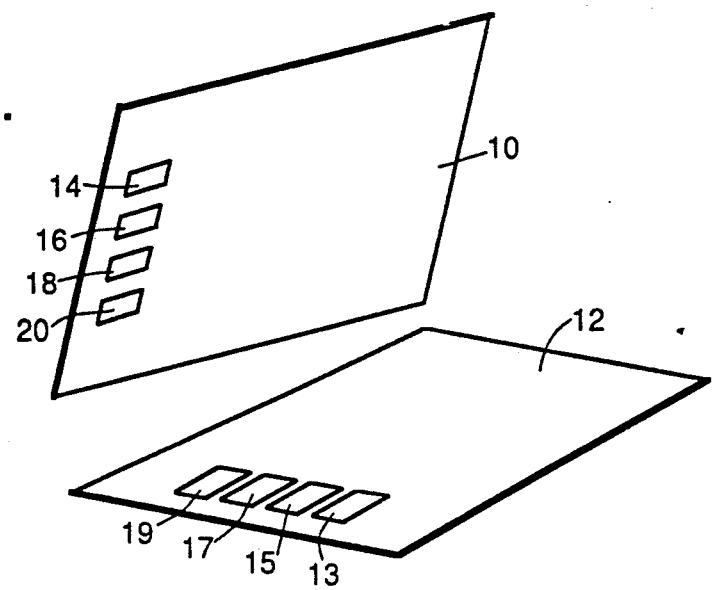
FIG. 1 is a representative surface view of a portion of a substrate and a surface view of a portion of a semiconductor chip, each having pads which can be electrochemically interconnected in accordance with the present invention.

FIG. 1 illustrates a portion of a representative semiconductor chip 10 and a portion of a substrate 12, each having pads which can be electrochemically interconnected according to the present invention. The semiconductor chip 10 has pads 14, 16, 18 and 20 which can be interconnected with their corresponding pads 13, 15, 17 and 19, respectively, on the substrate 12.

In general, the present process for interconnecting pads on semiconductor chips with pads on a substrate includes the steps of electrically shorting the pads on the substrate, creating conductive bumps on the pads on the substrate, aligning the pads on the substrate with the pads on the semiconductor chips and then depositing metal to the bumps to form an electrical interconnection. A representative process for interconnecting pads 14, 16, 18 and 20 on semiconductor chip 10 with pads 13, 15, 17 and 19 on substrate 12 is illustrated in FIGS. 2a–2g, which will be referenced during the following discussion.

Figure 2A:
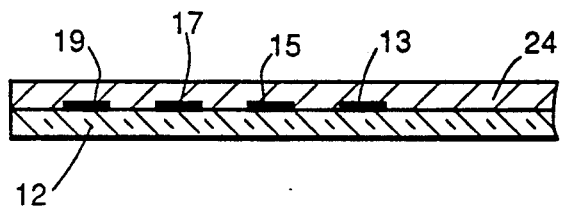
FIG. 2a is representative cross-sectional view of a substrate and pads on a substrate with a film conductive shorting metal deposited on the substrate and on the pads on the substrate.

In accordance with the present invention, electrically shorting the pads on the substrate is accomplished by depositing a film of conductive metal over the substrate and the pads on the substrate. FIG. 2a illustrates a cross-sectional view of the substrate 12 and pads 13, 15, 17 and 19 on the substrate 12 covered with a thin film of conductive shorting metal 24. The thickness of the conductive metal film 24 and the type of metal deposited is such that the resulting conductive metal film 24 can be connected to a metal plating power supply and metal can be effectively electroplated to the film 24.

The preferable method for forming the film of conductive metal 24 is by vapor depositing the metal using known vapor deposition techniques. Typically, metal is deposited to form films which are about 1000 angstroms thick. Suitable metals are those which can be easily vapor deposited and are compatible with the substrate surface. Since portions of the metal film 24 will later be removed from the substrate 12, the metal must be capable of being removed or dissolved away with minimal or no attack to the portion of the pad which forms the interconnection. Particularly suitable metals include aluminum, zinc, cadmium, copper, nickel, cobalt and silver. The specific selection of which of these metals or combination of metals is most suitable to use will depend on the means of later removing these "shorting" metals 24 without undue compromise of the plateable metal selected to form the electrochemical interconnection. For example, if the conductive metal film 24 is aluminum, which can be removed with caustic or hydrochloric acid, then the preferred metals to form the electrochemical interconnection might be gold, nickel, cobalt or copper, as these metals are minimally affected by caustic or hydrochloric acid. Similarly, conductive film 24 might be zinc which is easily removed by hydrochloric acid which again permits the electrochemical interconnection to be reliably formed with the previously listed metals. Cadmium is another preferred selection for the conductive metal 24 as it can be readily removed with ammonium nitrate without meaningfully affecting these preferred electrochemical interconnection metals.

The next step in this interconnection process involves formation of a conductive bump on the pad surface. Creating conductive bumps on the pads on the substrate, in accordance with the present invention, aids in producing reliable final bonds between the substrate and the semiconductor chips. Typically the bumps are created using electrochemical techniques to form a particular bump geometry on the pads on the substrate. Preferred bump geometries are those in which the size of the bump at its base, nearest the substrate, is larger than the size of the bump at its tip. Particularly suitable bump geometries include shapes much like a pencil point configuration and shapes similar to the end of a flat edge screw driver tip. In order to form the bumps exclusively on the pads on the substrate and to form the bumps in the preferred geometry, photoimaging techniques are preferably utilized.

Figure 2B:
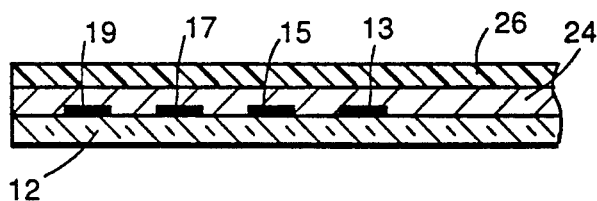
FIG. 2b is a cross-sectional view of a substrate illustrating the results of applying a layer of photoresist to the film of conductive metal.
Figure 2C:
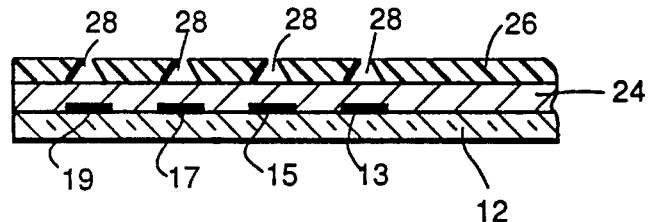
FIG. 2c is a cross-sectional view of the substrate of FIG. 2b after the photoresist is processed to define bump cavities.
Figure 2D:
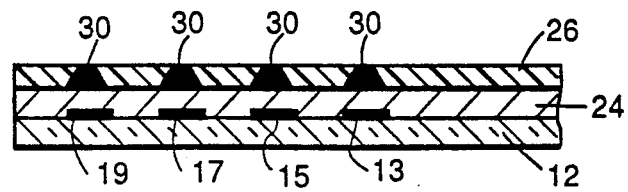
FIG. 2d is a cross-sectional view of a representative substrate after the bumps are created.

A representative process for creating conductive bumps on the pads on the substrate 12 using photoimaging techniques is illustrated in FIGS. 2b–2d. The first step is shown in FIG. 2b and consists of applying and adhering a layer of photoresist 26 to the film of conductive metal 24 on the substrate 12. In accordance with the present invention, after applying the layer of photoresist 26 to the film of conductive metal 24, the photoresist is processed by known exposure and developing techniques to expose the pads for plating. As shown in FIG. 2c after developing, the photoresist has holes or openings which define cavities 28 that are located over the pads 13, 15, 17 and 19 on the substrate 12. The cavities 28 preferably have a shape or geometry which resembles a straight edge screw driver tip. The cavities 28 may also be in the general shape of a pencil tip or other similar frusto-conical configuration.

After processing the photoresist, the next step in creating the conductive bumps is to deposit conductive metal into the cavities 28 defined by the photoresist 26. Once the bumps are created in the preferred geometry, they are registered on the pads on the substrate and have heights which range from about 10 microns to about 100 microns. FIG. 2d is a representative cross-sectional view of the substrate 12 after the bumps 30 are formed. In addition to the bumps 30 and the substrate 12, FIG. 2d shows the photoresist 26, the layer of conductive shorting metal 24 and the pads 13, 15, 17 and 19 on the substrate 12. Formation of bumps 30 is preferably accomplished using electroplating techniques in which the substrate 12 is made cathodic and an anode is provided in contact with an electroplating solution. Then a plating solution is pumped past the cavities 28, and bumps 30 are grown in the shape of the cavities 28 as metal is electroplated. Optimum electrodeposition conditions can be achieved by pumping the plating solution with vacuum/pulse pumps. Generally this type of pump causes solutions to expand and contract so that the solutions flow into and out of small and narrow configurations. These pumps are described in more detail below. Optionally, the plating solutions can also be prepared using suitable surfactants or wetting agents which enhance the ability of the plating solution to flow into small areas and wet the surfaces of the photoresist defined cavities and to readily remove gassing reaction products.

In accordance with the present invention, techniques other than electrodeposition for creating conductive bumps, which also utilize photoresist defined cavities and photoresist as a mask can also be used. For example, vapor depositing metals such as indium, copper, or nickel into the photoresist defined cavities 28 provides bumps having the desired geometries. Alternatively, bumps of the preferred geometry can be created with or without the use of photoresist by laser plating. Such methods are described by C. Booking in "Laser Enhanced & High Speed Jet Selective Electrodeposition", *Trans IMF*, 66, 50, 1988.

In accordance with the present invention, aligning the bumps 30 on the substrate 12 with the corresponding pads 14, 16, 18 and 20 on the semiconductor chip 10 can be advantageously accomplished using manual techniques. A method for aligning the pads 14, 16, 18 and 20 on the semiconductor chip 10 with the corresponding bumps 30 on the substrate is illustrated in FIG.

Figure 2E:
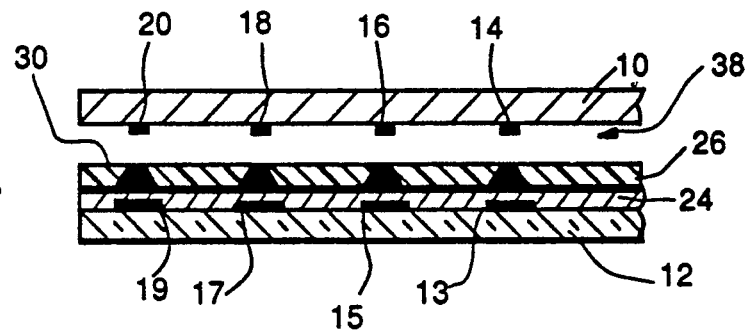
FIG. 2e is a cross-sectional view of a representative substrate and a representative semiconductor chip illustrating aligning the pads on the substrate with the corresponding pads on the semiconductor chip.

2e which shows a cross-sectional view of a substrate 12 and semiconductor chip 10. The method includes positioning the substrate 12 so that the bumps 30 on the substrate 12 are in close proximity with the corresponding pads 14, 16, 18 and 20 on the semiconductor chip 10. The degree of close proximity is such that space 38 is provided to avoid electrical shorting of the pads on the semiconductor chip with the pads on the substrate and to permit plating solution to flow between these surfaces. Also illustrated in FIG. 2e is the film of conductive metal 24 and the layer of photoresist 26.

As will be discussed below, when electrochemical methods are used to form the final interconnecting bond, a metal deposit grows from the bump towards its corresponding pad on a semiconductor chip. During the growth, the deposit seeks the pad on the semiconductor chip due to bipolar effects created during the electrodeposition process. Thus, misalignments do not adversely affect the reliability of the interconnecting bond and costly precision alignment methods are not required.

Figure 2F:
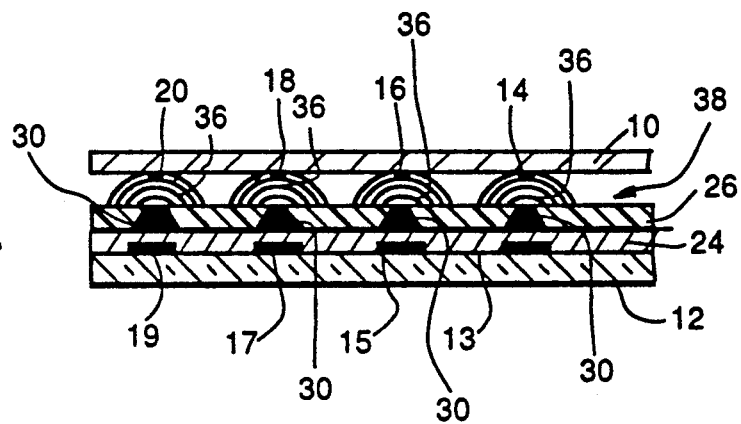
FIG. 2f is a cross-sectional view of a representative substrate and a representative semiconductor chip illustrating the effects of depositing metal to the bumps on the pads on the substrate.

Depositing conductive metal to the bumps 30 can be accomplished using electrochemical plating techniques similar to those described above. This includes making the bumps 30 on the pads on the substrate 12 cathodic and providing an external anode in contact with an electroplating solution, and pumping the electroplating solution past the bumps on the substrate and the pads on the semiconductor chip. FIG. 2f illustrates the effects of the metal electrodeposition process. During the pumping process, metal deposits 36 form on the bumps 30 and within a narrow passage 38 between the bumps 30 and the semiconductor chip 10. The metal grows to eventually contact the corresponding pads 14, 16, 18 and 20 on the semiconductor chip 10. Also shown in FIG. 2f are the layer of conductive metal 24 and the photoresist 26 which are still in place. When the growing electrodeposited metal 36 finally seeks out and makes contact with the corresponding pads 14, 16, 18 and 20 on the semiconductor chip 10, the pads will become cathodic as well and then plated metal will deposit on both the growing bump surface and the semiconductor chip pad surface.

It is also contemplated to be within the scope of the present invention to use alternate methods to deposit metal to the bumps for forming the final interconnecting bonds. For example, electroless deposition techniques which do not depend upon external electrical circuits but deposit layers of metal using chemical reduction reactions can be used.

When pads on flip chips are being interconnected with corresponding bumps on a substrate in accordance with the present invention, there are typically 256 pads on the periphery of the chip which are in close contact with the bumps on a substrate. To effectively pump a plating solution to the bumps 30 on the substrate 12 and the pads 14, 16, 18 and 20 on the semiconductor chip 10, there should be a good circulation with fresh plating solution continually available at the plating site within the narrow passage shown as 38 in FIG. 2f.

Suitable pumps which are capable of providing solution to the narrow passages 38 include vacuum/pulse pumps mentioned above. These pumps can quickly pull a vacuum above a contained solution and then release the vacuum at a rapid frequency. Pulling a vacuum has the effect of boiling or nucleating bubbles at the area to be plated which causes the old solution to be pushed out. When the vacuum is released new undepleted solution reenters the narrow passage. This continual flushing and replenishment with new solution assures a rapid plating deposition rate.

When a plated metal bond is created by plating metal on both surfaces, the resulting structural integrity is highly dependent upon the contact angle or the angle that occurs when the plating from one surface just touches the plating from another surface. Contact angles greater than 90° create plating conditions that favor structurally strong interconnections. Contact angles less the 90° tend to promote the phenomena of cleavage planes or planes of weakness. Advantageously, suitable contact angles can be maintained with the preferred bump geometries, such as frusto-conical shapes and flat edge screw driver shapes. Other factors which contribute to structurally strong interconnections are slight displacement of the semiconductor chip pad relative to the corresponding bumps on the substrate, and bipolar effects which cause the growing electrodeposited metal to seek out the corresponding pad.

A variety of metals are suitable for forming both the bumps and interconnecting bonds by electroplating. Typically electroplated copper bond strength is approximately an order of two magnitudes stronger than the bonds obtained using known cold welded indium and at least twice as strong as known solder bonds. Other metals which form suitably strong bonds include gold, silver, nickel, cobalt, tin, lead, tin/lead and indium. However, this selection will be dependent upon maintaining the integrity of the selected metal electrochemical interconnection bond to survive removal of the conductive film 24 shown in FIGS. 2a-2f. If some attack of the electrochemical interconnection bond is acceptable, then even zinc or cadmium might be used as the selected metal to form the electrochemical interconnection bond or these metals might be overplated with a metal that better withstands the conductive film 24 removal process. The controlling criteria in the selection of a metal is that the metal can be plated using a process that is compatible with the other steps involved with forming the interconnection and the materials which are to be connected. The metal should also have good throwing power and good physical characteristics for the final intended use of the semiconductor chip and substrate.

Once the electrochemical interconnections are formed, removing the thin film of conductive metal on the substrate can be accomplished by pumping an appropriate stripper solution to the substrate. The electrochemical interconnection remains intact and similarly the film of conductive metal remains over the pads. As mentioned above a vacuum/pulse pump is particularly suitable for pumping solutions into the narrow passage between the semiconductor chip and the substrate and can be utilized to pump solutions which dissolve the thin metal film. For example, dilute hydrochloric acid solutions will remove a film of zinc; ammonium nitrate solutions will remove a film of cadmium; and caustic solutions (NaOH) or hydrochloric acid will remove aluminum. When the film of shorting metal is copper or nickel, and the interconnection is also copper or nickel, the film can be removed without effectively attacking the interconnection metal because the film of shorting metal is so thin (about 1000 angstroms). The film is quickly removed and then a suitable cleaning solvent such as deionized water can then be flushed over the substrate and semiconductor chip surfaces to halt the film dissolution process.

It is also desirable at this point in the process to remove the photoresist mask on the substrate. This can be accomplished by pumping the appropriate photoresist stripping solution to the mask area using a suitable pumping system such as the vacuum/pulse pump or submerging the substrate and semiconductor chip in a stripping solution. Suitable stripping solutions are used extensively within the electronics industry and they are commercially available.

Figure 2G:
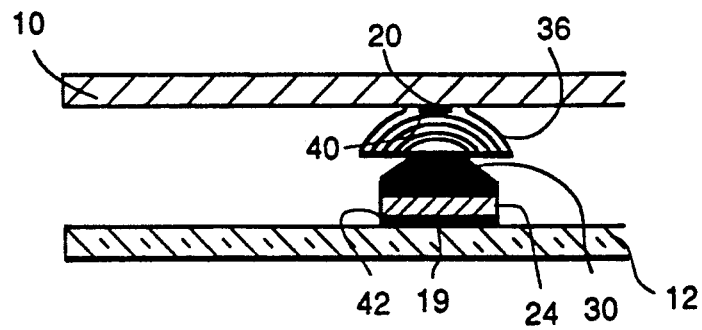
FIG. 2g is dross-sectional view of a representative electrochemical interconnection fabricated in accordance with the teachings of the present invention.

For simplicity and clarity of illustration, FIG. 2g shows a single completed electrochemical interconnection wherein pads 19 and 20 are connected together. Thus, only one of the semiconductor chip pads and one substrate pad illustrated in FIGS. 2a-2f is shown having the preferred contact angle as described above. The completed electrochemical interconnection includes semiconductor chip pad 20 having a surface 40 and substrate pad 19 having a surface 42. The substrate pad surface 42 has a film of conductive material 24 and conductive bump 30 integral with the film of conductive metal 24. The conductive bump 30 and the semiconductor chip pad 20 are joined in electrical communication by an electroplated deposit 36.

Electrochemical interconnections of the type illustrated in FIG. 2g typically have tensile strengths in the range of 17,000 psi or 117 megapascals. The high strength interconnections are particularly suitable for applications which are structurally demanding.

In another embodiment of the present invention, the process for interconnecting semiconductor chip pads with substrate chip pads described above further includes the step of electrically shorting pads on the semiconductor chip prior to creating the conductive bumps on the pads on the substrate. In accordance with the present invention, the practice of this embodiment also includes the steps of creating conductive bumps on the pads on the semiconductor chip prior to aligning the pads on the substrate with the pads on the semiconductor chip.

In accordance with this embodiment, once bumps are created on the pads on the semiconductor chip, aligning the pads on the semiconductor chip with the pads on the substrate involves aligning the respective bumps on the substrate to be in close proximity with the bumps on the semiconductor chip. Alternately, as discussed above, the alignment process can include placing the bumps on the substrate in intimate contact with the bumps of the semiconductor chip. Now it is possible to either make the substrate pads or the substrate and chip pads cathodic. As described above, metal then deposits directly on the cathodically connected pads. When the pads on both the chip and substrate are made cathodic there is the substantial advantage of decreased processing time and creation of a superior, greater than 90 degree contact geometry bond, but the disadvantage of additionally shorting the pads on the semiconductor chip and creating bumps on the pads on the semiconductor chip. When only the pads on the chip or substrate are made cathodic then there is no advantage in decreased processing time but a superior, greater than 90 degree contact geometry bond is created with the above-noted disadvantage. This has the advantage of substantially decreasing the amount of metal deposition time required. This is particularly useful for periphery chip interconnection but may prove to be a disadvantage for sensor chips with a very large number of checkerboard interconnections internal from the periphery due to the throwing power of the particular plating solution used to create the electrochemical connection.

The practice of the above-described alternate embodiment of the present invention can be carried out using the same techniques described for the first preferred embodiment. For example, electrically shorting the pads on the semiconductor chip can be accomplished by vapor depositing a film of conductive shorting metal over the pads on the semiconductor chip and over the semiconductor chip itself. Similarly, creating bumps on the pads on the semiconductor chip is advantageously performed by applying photoresist to the film of conductive shorting metal, processing the photoresist so that the pads on the semiconductor chip are exposed for plating and so that the photoresist defines cavities on the pads on the semiconductor chip, and finally depositing conductive metal into the photoresist defined cavities to create the conductive bump. All of the techniques described above for creating bumps on the pads on the substrate are applicable to creating the bumps on the pads on the semiconductor chip and should be considered in all of their forms when practicing the present embodiment of this invention.

Figure 3:
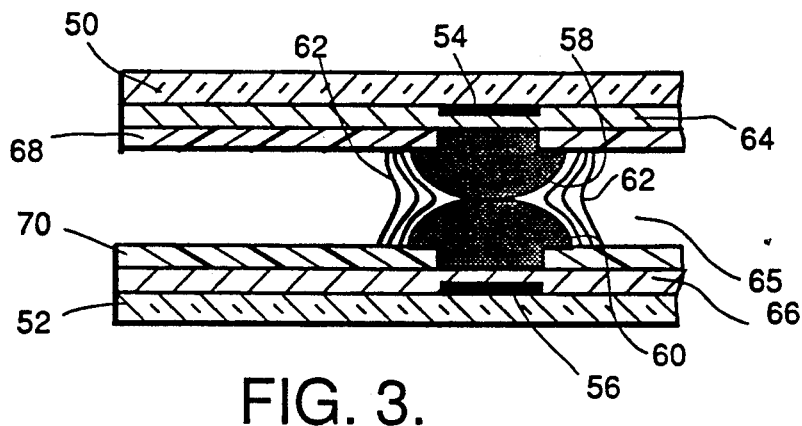
FIG. 3 is a cross-sectional view of a representative substrate and semiconductor chip, each having bumps created on their corresponding pads in accordance with the present invention.

FIG. 3 illustrates the just described embodiment of the present invention in which a preferred bump geometry is formed on a substrate pad and a semiconductor chip pad. This embodiment also includes aligning the substrate bumps with the semiconductor chip bumps by placing them in intimate contact. Shown in FIG. 3 is semiconductor chip 50 and substrate 52 with corresponding pads 54 and 56, respectively. Pads 54 and 56 each have formed thereon a preferred bump geometry 58 and 60, which are aligned so that the bumps 58 and 60 are in intimate contact. Because the bump is grown above the level of the photoresist, a nodular shaped bump is formed. Also illustrated in FIG. 3 are films of conductive metal 64 and 66 deposited over the semiconductor chip 50, the semiconductor chip pad 54, the substrate 52, and the substrate pad 56. Layers of photoresist 68 and 70 are shown deposited over the films of conductive metal 64 and 66, respectively. Electrodeposited metal 62, forms the interconnecting bond between semiconductor chip 50 and substrate 52. In order for the bumps to be aligned in intimate contact, bumps 58 and 60 extend beyond photoresist layers 68 and 70. This configuration provides a gap 65 between photoresist layers 68 and 70. Gap 65 allows for plating solution to flow past bumps 58 and 60 and deposit on bump surfaces.

Figure 3A:
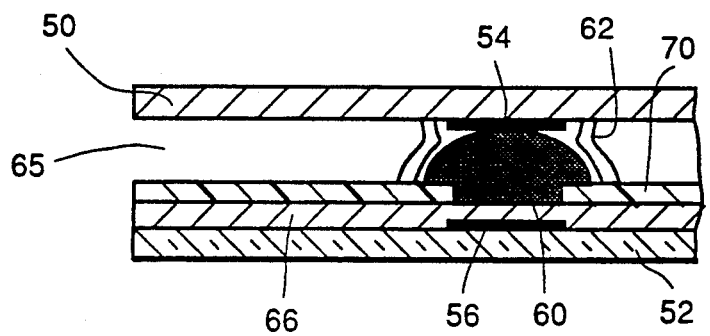
FIG. 3a is a cross-sectional view of a representative substrate and semiconductor chip, in which only the substrate has a bump, formed on its pad in accordance with the present invention.

FIG. 3 illustrates an electrochemical interconnection between a semiconductor chip and a substrate, each of which has bumps formed in a preferred configuration with the interconnection grown between the bumps placed in intimate contact. Similarly, electrochemical interconnections between semiconductor chip pads and substrate pads in intimate contact, only one of which has a bump such as those shown in FIG. 2a-2g, can be formed in accordance with the teachings of the present invention. FIG. 3a illustrates such an interconnection prior to removing the photoresist and prior to removing the portion of the layer of conducting metal not registered on the pad. More particularly, FIG. 3a illustrates a substrate 52, substrate pad 56 and layer of conductive metal 66 deposited over the substrate 52 and substrate pad 56. Photoresist layer 70 is processed to form a cavity for bump 60 which extends above the top of the photoresist layer 70. A semiconductor chip 50 has a chip pad 54 which is placed in intimate contact with or in close proximity to bump 60 forming gap 65 between the semiconductor chip and the substrate. Electrochemical interconnection 62 forms in a configuration which causes the semiconductor chip and the substrate to grow together.

In practicing processes for electrochemically interconnecting chips according to the present invention, it is possible to align different opposing bumps on the same substrate or the same chip in intimate contact and in close contact. As mentioned above, when the metal is deposited on both the bumps on the semiconductor chip and the bumps on the substrate, the structural integrity of the plated metal bond is not assured unless the contact angle is greater than 90°. Accordingly, such parameters as the bump geometry, the slight displacement of the corresponding bumps relative to each other, and the advantageous assistance from bipolar effects are particularly important.

Once the interconnecting bond is formed, the thin film of conductive shorting metal, which is not registered on the pads, must be removed from the semiconductor chip and the substrate without disturbing the interconnecting bond. Similarly, the photoresist mask must also be removed from the substrate and semiconductor chip. Removing both the film of conductive shorting metal and the photoresist mask can be accomplished as described above.

Figure 4:
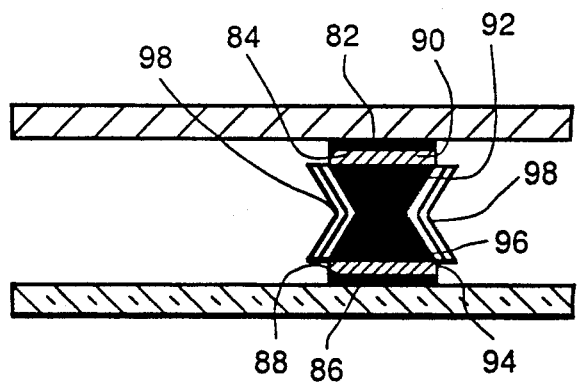
FIG. 4 is a cross-sectional view of a representative electrochemical interconnection formed in accordance with the present invention.

FIG. 4 illustrates an electrochemical interconnection formed in accordance with the present invention, wherein bumps are created on the semiconductor chip pads as well as the substrate pads and the pads are aligned so that the bumps are in intimate contact with each other. The device illustrated in FIG. 4 details the interconnection of FIG. 3 after removal of the photoresist and exposed film of conducting metal. Shown in FIG. 4 is an interconnection in which a semiconductor chip pad 82 has a surface 84, and a substrate pad 86 has a surface 88. The surface of semiconductor chip pad 84 also has a film of conductive metal 90 and a conductive bump 92 integral with the film of conductive metal 90. The surface 88 of the substrate pad 86 also has a film of conductive metal 94 and a conductive bump 96 integral with the film of conductive metal 94. The conductive bump 92 and the conductive bump 96 are joined in electrical communication by an electroplated deposit 98. The electroplated deposit 98 grows in the gap area, illustrated in FIG. 3 at 65 created when the bumps are grown higher than the photoresist. Even though bumps 92 and 96 are in intimate contact, the plating solution flows into the gap to form deposit 98. In one embodiment, the preferred bump geometry is in the shape of a flat screw driver blade tip. The bumps 92 and 96 are formed so that when they are aligned the blade tips are oriented to form a cross at their points of intimate contact. This configuration provides a particularly strong electroplated deposit at the contact points.

Another embodiment of the present invention includes processes for forming interconnections in cases where the substrate has pads which can be electrically accessed from an area of the substrate other than the surface directly below the pads. This surface can be the back-side of the substrate or an area surrounding the substrate pads. In accordance with the present invention, this process includes the steps of electrically shorting pads on the substrate by depositing a film of shorting conductive metal over a substrate surface area having electrical access to said substrate pads. Then creating conductive bumps can be accomplished by masking the substrate surface area having the film of shorting conductive metal and electrodepositing metal to the substrate pads. Finally, aligning the pads on the substrate with the corresponding pads on the semiconductor chip and depositing metal to the bumps forms an interconnection between the pads on the semiconductor chip and pads on the substrate.

Those methods described above for depositing films of shorting conductive metal such as vapor deposition are equally applicable in the practice of this embodiment. Similarly, processes described above for electrodepositing metal to the substrate pads can be utilized when creating the bumps. Additionally as taught above, when aligning the pads on the semiconductor chip with pads on the substrate all of the techniques described above are applicable and should be considered in all of their forms when practicing the present embodiment of this invention. After the interconnection between the pads on the semiconductor chip and the pads on the substrate is formed the mask is removed and the shorting metal is removed using methods and techniques previously described.

The practice of the just described embodiment of the invention can additionally include forming bumps on the semiconductor chip pads. Creating bumps on the semiconductor chip pads can be accomplished in the manner just previously described for cases in which the semiconductor chip pads can be electrically accessed from a semiconductor chip surface area other than the surface directly below the pads. Alternatively, creating the bumps can be accomplished using the methods described in FIGS. 2a-2g.

The interconnections formed according to this embodiment have all the advantages of the previously described embodiments and additionally include process advantages. These include ease of removing the mask and conductive shorting metal and avoiding the necessity of using photoresist on the substrate and/or chip surfaces which directly face each other.

In accordance with the present invention, the electrochemically interconnected semiconductor chips and substrates can be separated for rework purposes or for repair purposes when one or more semiconductor chips need to be removed from a substrate and replaced. This rework feature is a particularly important advantage, because the ability to rework electronic components can avoid potentially large costs in scrapping functioning components on substrates because only one component has failed.

The rework procedure can be carried out by chemically dissolving the plated interconnection and then physically separating the semiconductor chips from the substrate. Preferably the vacuum/pulse pump system described above is utilized to pump a suitable solvent system to the interconnect between the semiconductor chip and the substrate. Suitable solvents for copper, nickel, cobalt and silver are oxidizing acids such as nitric acid. Gold can be dissolved in a number of commercially available gold stripping solutions.

As mentioned earlier, the above described processes for forming strong, ductile, and conductive electrochemical interconnections are especially suitable for interconnecting pads on substrates and their corresponding pads on semiconductor chips when the pads are at the periphery of the chip, such as flip chips. When sensor chips are interconnected to the pads on a substrate a very large number of interconnections may be required. These sensor chip interconnections are typically arranged in a checkerboard pattern. This dense checkerboard interconnection system causes special problems. Typically these chips have 128 pads across by 128 pads down for a total of over 16000 interconnections per chip. Each is about 1 mil (0.003 cm) in size and located within a 0.25 square inch (1.61 cm$^2$) area.

Creating bumps in a preferred geometry on the substrates and/or sensor chips can be accomplished using the techniques described above, however, modifications in the methods for depositing the final interconnection are preferred. Such modifications consist of special shorting metal circuitry on the pads on the substrate, or shorting out the pads into two interleaving patterns, and maintaining a voltage potential on the anode so that it does not dissolve.

The two interleaving shorting pattern consists of a first pattern having every other row of 128 pads shorted and the second interleaving shorting pattern electrically shorts out the remaining rows of 128 pads. This results in comb-like patterns in which the prongs of the comb of the first pattern are interweaved with the prongs of the comb of the second pattern. The first comb pattern is electrically connected to one polarity of a DC plating periodic reverse power supply. The second comb pattern is electrically connected to the other polarity of the same DC plating periodic reverse power supply.

In order to maintain a voltage potential on the anode so that it does not dissolve, a chemical reducing agent such as hydrazine, hypophosphite or dimethylamine borane is added to the plating solution in such concentration that at the operating temperature of the plating solution, the anodic side of the comb pattern is cathodically protected and will not dissolve. When the DC periodic reverse power supply is turned on and set at normal operating current densities, plated metal will be deposited on the cathode but the anodic side of the comb pattern will not be dissolved away due to the presence of the reducing agent.

Furthermore, when the periodic reverse feature is turned on and set for reversing the DC polarity at, for example 5 second intervals, metal will deposit on the first comb pattern for 5 seconds and metal will deposit on the second comb pattern for the following 5 seconds. Since the anodic side will not dissolve, there will be a net build-up of metal on both comb patterns that will eventually seek out and bridge the gap from the substrate to the sensor chip. As mentioned above this seek out feature is the result of the bipolar effect created during the electroplating process.

The above described process is well suited for interconnecting sensor chips having checkerboard pad arrays. The process provides for shorting out of the pads in two patterns while at the same time safeguarding against dissolving the anode. In addition, the process can be used to interconnect pads on flip chips to pads on substrates. This can be accomplished by interconnecting every other pad to opposite polarities of a DC plating periodic reverse power supply and proceeding as described above.

The principles in this disclosure are also useful in improving the interconnection reliability of already soldered or indium cold welded flip chips connected to pads on their substrates. This evolution can improve the interconnection strength, resist interconnection creep and improve the corrosion resistance of the interconnection. In this particular application the already formed interconnection bond is overplated with a metal selected for these particular properties. This overplate can either be done by electrodeposition in a manner similar to the electrochemical formation of interconnection bond previously described for sensor chips or could be done by catalytic deposition. This application is particularly useful for improving the interconnection strength and corrosion resistance of cold welded indium bonds. In this application the indium is overplated with a strong corrosion resistance metal such as electroplated nickel or cobalt or electroless nickel or electroless cobalt to a sufficient thickness as to not compromise the electrical individuality of each contact but of sufficient thickness to improve bond strength and corrosion resistance. Typically this thickness might be 50 $\mu$in (0.00013 cm) to 1000 $\mu$in (0.0025 cm) as might be permitted by the discrete spacing of the interconnection matrix.

Having thus described exemplary embodiments of the present invention, it should be noted by those skilled in the art that the within disclosures are exemplary only and that various other alternative, adaptations and modifications may be made within the scope of the present invention. Accordingly, the present invention is not limited to the specific embodiments as illustrated herein, but is limited only by the following claims.

What is claimed is:

1. A process for interconnecting pads on semiconductor chips with pads on a substrate, said process comprising the steps of:
   electrically shorting said pads on said substrate by providing a shorting layer;
   creating conductive bumps on said shorting layer above said pad on said substrate;
   aligning said pads on said substrate with said pads on said semiconductor chips; and
   depositing metal to said bumps to form an electrical interconnection between said pads on said semiconductor chip and said pads on said substrate.

2. The process of claim 1 wherein electrically shorting said pads on said substrate is accomplished by depositing a film of shorting conductive metal over said substrate and over said pads on said substrate, said film of conductive metal being sufficient to electrically connect said film of conductive metal to a metal plating power supply.

3. The process of claim 2 further including the step of removing said shorting conductive metal from said substrate, said shorting conductive metal remaining over said pads, and wherein said electrical shorting is eliminated after depositing metal on said bumps.

4. The process of claim 1 wherein creating said conductive bumps further includes the steps of:
   applying photoresist to said film of conductive metal on said substrate;
   processing said photoresist so that portions of said shorting layer above said pads on said substrate are exposed for plating and said photoresist defines cavities above said pads on said substrate; and
   depositing conductive metal into said photoresist defined cavities wherein said conductive bumps are created.

5. The process of claim 4 further including the step of removing said photoresist from said substrate after depositing metal on said bumps.

6. The process of claim 1 further including the step of creating conductive bumps on said pads on said semiconductor chips prior to aligning said pads on said substrate with said pads on said semiconductor chips.

7. The process of claim 6 wherein aligning said pads on said semiconductor chips with said pads on said substrate further includes the step of placing said bumps on said substrate in intimate contact with said pads on said semiconductor chip, said intimate contact being sufficient to electrically short said bumps on said substrate and said bumps on said semiconductor chips.

8. The process of claim 7 wherein depositing metal to said bumps on said substrate further includes the steps of:
   making said bumps on said substrate and said bumps on said semiconductor chips cathodic;
   providing an external anode in contact with a plating solution; and
   pumping said plating solution to said bumps wherein metal is electroplated on said bumps on said substrate and metal is electroplated on said bumps on said semiconductor chip.

9. The process of claim 8 wherein said electroplated metal is selected from the group of metals consisting of copper, nickel, gold, silver, zinc, cadmium, indium, tin, lead, cobalt, and their plateable alloys.

10. The process of claim 1 wherein aligning said pads on said semiconductor chips with said pads on said substrate is accomplished by placing said bumps on said substrate in close proximity with said pads on said semiconductor chip, said close contact being sufficient to avoid electrical shorting of said pads on said semiconductor chip from said pads on said substrate.

11. The process of claim 10 wherein depositing metal to said bumps further includes the steps of:
   making said bumps cathodic;
   providing an external anode in contact with an electroplating solution;
   pumping said electroplating solution to said pads on said semiconductor chip and said bumps on said substrate wherein metal is deposited on said bumps on said substrate and grows to contact said pads on said semiconductor chip.

12. A process for improving the reliability of the interconnection between soldered chip pads and substrate pads, said process comprising the steps of:
   providing a soldered interconnection, said interconnection connecting said chip pads to said substrate pads; and
   depositing metal to said interconnection, including the steps of:
   making said interconnection cathodic;
   providing an external anode in contact with an electroplating solution; and
   pumping said electroplating solution to said interconnection wherein metal is electroplated on said interconnection.

13. The process of claim 12 wherein said electroplated metal is selected from the group of metals consisting of nickel, cobalt, copper, silver, zinc, cadmium, lead, and their plateable alloys.

14. The process of claim 12 wherein said electroplated metal is from 0.00005 inches (0.00013 cm) to 0.001 inches (0.0025 cm) thick.

* * * * *